United States Patent [19]

Briska et al.

[11] 4,313,773
[45] Feb. 2, 1982

[54] METHOD FOR REMOVING BOROSILICATE AND BORON RICH OXIDES FROM A SILICON BODY PRIOR TO DOPING SILICON BODIES WITH A SiB$_6$ SOLID SOURCE

[75] Inventors: Marian Briska, Boeblingen; Gert Metzger, Schoenaich; Klaus P. Thiel, Boeblingen, all of Fed. Rep. of Germany

[73] Assignee: International Business Machines Corporation, Armonk, N.Y.

[21] Appl. No.: 212,304

[22] Filed: Dec. 3, 1980

[30] Foreign Application Priority Data

Dec. 20, 1979 [DE] Fed. Rep. of Germany ....... 2951292

[51] Int. Cl.$^3$ .................. H01L 21/225; H01L 21/306
[52] U.S. Cl. .................................. 148/188; 156/653; 156/663; 156/628; 427/344
[58] Field of Search ............... 156/628, 653, 662, 663; 148/188; 427/344

[56] References Cited

U.S. PATENT DOCUMENTS

| | | | |
|---|---|---|---|
| 2,847,287 | 8/1958 | Landgren | 156/662 |
| 3,061,495 | 10/1962 | Alford | 156/663 |
| 3,669,775 | 6/1972 | Porter | 156/663 |
| 3,751,314 | 8/1973 | Rankel | 156/628 |
| 3,784,424 | 1/1974 | Chang | 156/662 |
| 4,249,970 | 2/1981 | Briska et al. | 148/188 |

Primary Examiner—Jerome W. Massie
Attorney, Agent, or Firm—Joseph C. Redmond, Jr.

[57] ABSTRACT

A method for doping silicon bodies by the diffusion of boron into the bodies is described. The method is an improvement of processes where the silicon bodies are exposed in a first heating process to a gas mixture containing a predetermined boron quantity and boron and oxygen in a predetermined quantitative ratio and a second heating process is used to drive the boron into the silicon. In the method, a borosilicate glass layer and a boron-rich silicon dioxide layer are removed by first immersing the silicon body in hydrofluoric acid diluted with water and subsequently in an aqueous sulfuric acid/potassium permanganate solution.

11 Claims, 5 Drawing Figures

METHOD FOR REMOVING BOROSILICATE AND BORON RICH OXIDES FROM A SILICON BODY PRIOR TO DOPING SILICON BODIES WITH A SiB₆ SOLID SOURCE

DESCRIPTION

BACKGROUND OF THE INVENTION

1. Field of the Invention

The present invention relates to a method of doping silicon bodies through the diffusion of boron into the bodies. A borosilicate glass layer is applied to the partially masked surface of the silicon bodies. Beneath the borosilicate glass layer, an $SiB_6$ layer is formed on the unmasked areas. The silicon bodies are exposed to a gas mixture containing a predetermined boron quantity and boron and oxygen in a predetermined quantitative ratio to form the $SiB_6$ layer and the borosilicate glass layer. During a heating process at least part of the boron is driven into the silicon. Prior to the heating process the borosilicate glass is completely stripped off without affecting the $SiB_6$ layer.

2. Prior Art

Capsule diffusion methods are known for diffusing boron into silicon wherein silicon bodies are exposed to a gas which flows through a reaction tube and which contains a boron source. With capsule diffusion methods, highly homogeneous and reproducible results can be obtained. Capsule diffusion methods, however, have disadvantages related to the amount and complexity of material and apparatus required. Compared with capsule diffusions, boron diffusions by means of a boron source-containing gas stream flowing past the silicon bodies, i.e. so-called open diffusions, require a much smaller amount of apparatus and material. In these open diffusions, a boron glass is produced on the surface of the boron-doped silicon body since the highly heated silicon bodies are exposed to a gas stream containing an oxidizing boron.

An open diffusion method is described in German Offenlegungsschrift No. 23 16 520. In the method described, a borosilicate glass layer is applied on silicon wafers in an inert atmosphere during a first heat treatment. Simultaneously, a phase ($SiB_6$) containing silicon and boron is provided between the borosilicate layer and the silicon surface and a thin layer highly doped with boron is generated in the silicon surface. Toward the end of the first heat treatment, the silicon wafers are exposed to an oxidizing atmosphere for a predetermined period during which the $SiB_6$ phase is oxidized. The borosilicate glass layer and the layer of oxidized $SiB_6$ phase are stripped in an etchant. Subsequently, the boron from the thin highly doped layer is driven into the silicon in a second heat treatment. Although this method provides homogeneous and reproducible results in the fabrication of low-doping diffusion areas within very close tolerances over the silicon body and throughout the entire batch, the results obtained are not fully satisfactory in view of the increasing trend toward closely packed highly integrated circuits.

Another disadvantage of the method described in the aforementioned Offenlegungsschrift is that during oxygen treatment after boron oxide coating crystal dislocations are formed in the doped silicon areas and in the overlapping areas of zones doped with boron and arsenic. Frequently, these dislocations are the cause of short-circuits in bipolar transistors.

In order to remedy these disadvantages, German patent application No. P 28 38 928.8 suggests a diffusion method for boron doping of silicon, which saves time and costs and provides very homogeneous and highly reproducible results. Before the method described in this patent application had been invented it was thought that high diffusion results required that the $SiB_6$ phase had to be removed prior to the drive-in of the boron in the second heating process (K. M. Busen et al. in J. Electrochem. Soc., Vol. 115, March 1968, pages 291).

Surprisingly, it was found that it was possible to provide very homogeneous and highly reproducible results within very close tolerances, by completely stripping only the borosilicate glass without substantially affecting the $SiB_6$ layer prior to the second heating step.

A disadvantage of this method is that the borosilicate glass cannot be completely stripped with diluted hydrofluoric acid. The borosilicate glass can, however, be stripped by immersing the silicon wafers first for ten seconds in diluted hydrofluoric acid, then for 10 minutes in concentrated nitric acid heated to 95° C., and finally for another 30 seconds in diluted hydrofluric acid. The $SiB_6$ phase is not appreciably attacked in this stripping process, but the etching solution used for stripping the borosilicate glass has a number of disadvantages: The use of concentrated nitric acid heated to 95° C. causes environmental and safety problems. The hot nitric acid evaporates and is sucked off during the etching process so that nitrous gases reach the atmosphere. Furthermore, the apparatus used is exposed to corrosion. Therefore, it would be desirable to replace the hitherto used etching cycle for fully stripping only the borosilicate glass by a less dangerous process.

SUMMARY OF THE INVENTION

Figure 1A:
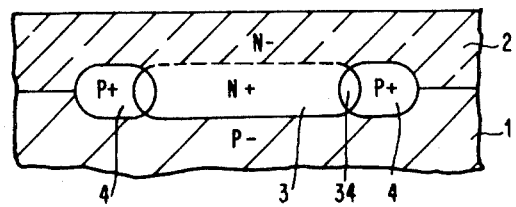
FIGS. 1A to 1E show schematic cross-sections of parts of an integrated circuit (vertical NPN transistor) in different phases of production.
Figure 1B:
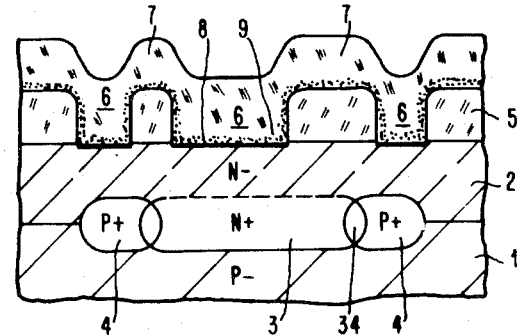
Figure 1C:
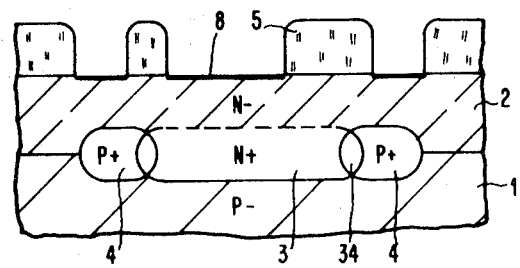
Figure 1D:
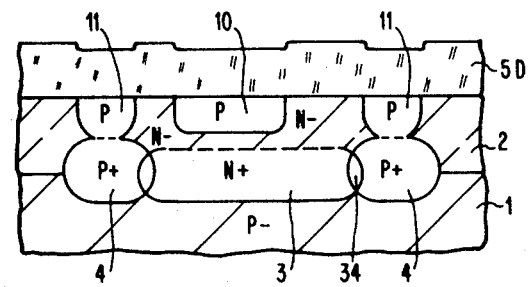

It is therefore the object of the invention to provide an improved method of doping silicon bodies through the diffusion of boron, wherein, prior to a drive-in heating process, the borosilicate glass and the sparingly soluble boron-rich borosilicate glass layer are completely stripped off without the $SiB_6$ phase being affected.

The object of the invention is achieved by a method of the above described type, which is characterized in that the borosilicate glass is stripped from the silicon bodies by immersing the bodies in hydrofluoric acid diluted with water followed by immersion in an aqueous sulfuric acid/potassium permanganate solution. If necessary, a second immersion in hydrofluoric acid diluted with water is used.

In one embodiment of the invention, the silicon bodies are first immersed in hydrofluoric acid diluted with water at a ratio of 1:10 followed by immersion in aqueous sulfuric acid of 10% by weight, containing 1.6 g/l potassium permanganate. The silicon bodies remain in the water-diluted hydrofluoric acid for approximately 10 to 30 seconds and in the aqueous sulfuric acid $KMnO_4$ solution they remain for approximately 1 to 3 minutes. Should another processing with diluted hydrofluoric acid be used, they remain therein for approximately 30 to 90 seconds. An important advantage is that the entire etching cycle can be performed at room temperature, i.e. at about 20° C., so as to avoid environmental and corrosion problems. Furthermore, the costs for the chemicals are reduced by a factor of 20, the solution can be prepared without any problems, and finally, according to measurement of surface resistance, the base diffusion profiles are not affected.

DETAILED DESCRIPTION OF THE PREFERRED EMBODIMENTS

Below, the method of the invention is described in conjunction with the doping of a base zone of a bipolar transistor.

Referring generally to the drawings, base zones 10 of bipolar transistors are made which have penetration depths between approximately 0.5 and approximately 1 $\mu$m after the second heating process and which have layer resistances (RS) of between approximately 300 and 700 ohm. A silicon substrate 1 of low P-doping ($5 \times 10^{15}$ boron atoms/cm$^3$) is used. In the silicon substrate 1, areas of high N-doping ($10^{20}$ arsenic atoms/cm$^3$) are provided as subcollectors 3. After the stripping of the silicon dioxide mask used for that purpose, epitaxial layer 2 is grown over the entire surface of substrate 1. This epitaxial layer has a low N-doping and contains approximately $2 \times 10^{16}$ arsenic atoms/cm$^3$. The arsenic atoms of epitaxial layer 2 will be diffused out through the areas of epitaxial layer 2 which are provided over subcollector 3.

For making base zone 10 of a bipolar transistor, which represents the essential application of the method as disclosed by the invention, a silicon dioxide layer 5 of approximately 380 nm thickness is grown on epitaxial layer 2. By means of conventional methods of photolithography the respective mask openings 6 are made therein. In a first heating process which takes place at temperatures between approximately 850° and 950° C., the silicon wafers, after having reached the coating temperature, are exposed to a gas atmosphere containing boron and oxygen. For that purpose, argon which contains BBr$_3$ and oxygen is directed over the wafers. The O$_2$:BBr$_3$-molar ratio in the reaction gas is between approximately 20 and 65, and the overall flow is approximately 3.5 l/min, with an addition of approximately 15 to 30 mg BBr$_3$/min.

Under these conditions, a layer 8 of SiB$_6$ phase forms over the entire exposed wafer surface including the mask surface. A layer 9 of sparingly soluble, boron-rich borosilicate glass is then formed. Borosilicate glass 7 which then forms thereon is very homogenous with respect to its thickness and its etchability. The coating time is generally determined by the desired surface resistance, the coating temperature, and whether an oxidizing or an inert atmosphere is used in the second heating process.

After coating, the silicon wafers are cooled to 70° to 100° C. within approximately 20 minutes and are then taken from the furnace. After the wafers have cooled to room temperature, the borosilicate glass 7 is stripped off. Its etchability depends on the O$_2$:BBr$_3$ ratio used for its fabrication.

In the first step of the etching cycle according to the invention, hydrofluoric acid, diluted with water at a ratio of from about 1:5 to about 1:20, preferably about 1:10, is left to act on the wafer for approximately 10 to 30 seconds. During this period, the finally deposited borosilicate glass layer 7 is stripped off. The sparingly soluble, boron-rich borosilicate glass layer 9 is then stripped from the surface of the silicon wafers and the silicon dioxide mask in a period of from about 1 to about 3 minutes by use of an aqueous sulfuric acid containing potassium permanganate. The aqueous sulfuric acid has from about 5 to about 20 percent by weight, preferably about 10 percent, of sulfuric acid and contains from about 0.5 to about 5 gm/l, preferably about 1.6, of potassium permanganate. The SiB$_6$ phase 8 in openings 6 is not affected by this etchant. It is an essential point to understand that the sparingly soluble borosilicate glass layer 9 can be removed at room temperature and in a highly diluted acid solution. If necessary, the processing with the sulfuric acid/potassium permanganate solution can be followed by again processing with hydrofluoric acid of the above-described dilution extending over approximately 30 to 90 seconds. During the entire etching cycle, the thickness of silicon dioxide mask 5 is reduced from approximately 380 nm to approximately 170 nm.

The etching cycle is followed by a second heating process in an oxidizing atmosphere at 925° C. 1.5 liter oxygen/minute for 10 minutes, then steam for 51 minutes, and finally 1.5 liter oxygen/minute for another 10 minutes are directed over the wafer surface covered with the silicon dioxide mask. During this heating process, the boron is driven from layer 8 (SiB$_6$ phase) into epitaxial layer 2, and base zone 10 is formed. At the same time, silicon dioxide continues to grow thermally over silicon dioxide mask 5, an overall thickness of approximately 300 nm being reached over the diffusion mask. Over the P-doped base zone 10 a layer thickness of approximately 200 nm of silicon dioxide is formed.

With the improved method of the present invention it is possible to reach much more homogeneous and reproducible results than prior art methods for fabrication of low-doping areas such as the base zones of bipolar transistors. Owing to easier control, the base width of bipolar transistors can be made smaller by hitherto known methods. Circuits of greater packing density, higher integration and greater reliability can be made. For completing the bipolar transistor, areas 12 and 13 of high N-doping are made in a known manner subsequent to the base diffusion, area 12 being used as emitter of the bipolar transistor, and area 13 for facilitating the connection of the collector to the silicon surface. The finished structure is covered with a silicon dioxide layer containing connection openings to areas 10, 11, 12 and 13.

The method of the invention is now described in detail with reference to the embodiment of FIGS. 1A to 1E.

FIG. 1A shows a substrate 1 of low P-doping. By means of conventional process steps (masking, doping) buried N+-layer 3 (subcollector) was formed in silicon substrate 1. Areas 4 of high P-doping were produced in accordance with known methods, such as described in German patent application No. P 28 38 928.8, page 14 and page 27. After stripping of the mask layer, N-epitaxial layer 2 is grown over the entire surface of substrate 1. While epitaxial layer 2 is being grown, the arsenic atoms and boron atoms are partly entered through outdiffusion from areas 3 and 4 in the areas of epitaxial layer 2 thereabove. FIG. 1A also shows overlapping areas 3, 4 between the arsenic-rich N-doped area 3 and the boron-rich P-doped area 4.

On the structure in accordance with FIG. 1A a silicon dioxide layer 5 is produced in a known manner, e.g. by means of thermal oxidation. Openings 6 are made in layer 5 by means of etching using a photoresist mask in the areas over subcollector 3 and the highly P-doped areas 4. On the partly masked surface of this structure (FIG. 1B) a layer (7, 8, 9) covering the entire surface is now formed. This layer consists of borosilicates of differing composition.

In accordance with German patent application No. P 28 38 928.8 (page 12, second paragraph, and end of page 25), a mixture containing argon as a carrier gas, $BBr_3$ and oxygen is directed over the silicon body surface to be covered during a first heating process at temperatures between approximately 850° and 950° C. As pointed out already, the decisive factor of this step is the BBr quantity, and the $O_2$:$BBr_3$ ratio. The molar ratio $O_2$:$BBr_3$ is advantageously between approximately 20 and 65. The reproducibility of the diffusion and the homogenity of the borosilicate glass with respect to its etchability are improved by a relatively low oxygen content. During this first heating process, there first forms on the surface exposed in openings 6 of epitaxial layer 2 a thin layer 8 of a silicon-rich boron phase ($SiB_6$). Over this layer and on the entire surface of silicon dioxide mask 5 there forms a thin layer 9 of a boron-rich silicon dioxide. Subsequently, a borosilicate glass layer 7 is deposited whose layer thickness, at a given temperature, depends on the processing time of the silicon bodies and on the concentration of the reactive components of the gas mixture.

After the boron diffusion and the cooling of the silicon bodies, the borosilicate glass layers 7 and 9 are completely removed in a second process step. The etching cycle described below does not attack the $SiB_6$ layer. First, the finally deposited borosilicate glass 7 is stripped in diluted hydrofluoric acid (ratio 1:10). This takes approximately 10 to 30 seconds. The boron-rich silicon dioxide layer 9 covering the surfaces of epitaxial layer 2 and the silicon dioxide mask 5 are not attacked by the dilute hydrofluoric acid. The boron-rich silicon dioxide layer 9, however, is completely removed by the etchant described below. An aqueous sulfuric acid of 10% by weight containing approximately 1.6 g/l potassium permanganate is allowed to act for approximately 1 to 3 minutes on the boron-rich silicon dioxide layer 9 which is completely removed during this period. $SiB_6$ layer 8, the silicon dioxide structures, and the silicon itself are not attacked by the sulfuric acid/potassium permanganate solution. Following this processing, in an optional step, the silicon wafers are once more immersed for approximately 30 to 90 seconds in diluted hydrofluoric acid (ratio 1:10). The surface resistance values measured in the boron-doped areas are not affected by the exclusion of the third etching step. It should once more be pointed out that according to the invention, the boron-rich silicon glass layer 9 can be fully removed by a harmless etching solution instead of with the formerly used concentrated nitric acid heated to 90° C.

Figure 1E:
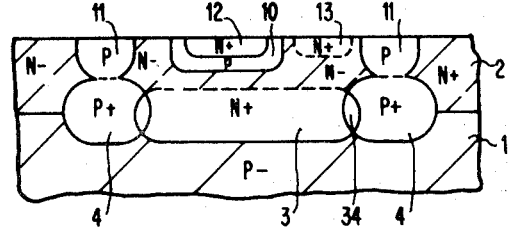

After the stripping of the borosilicate glass, the silicon wafers (FIG. 1C) are exposed to a second heating process. It is important in the fabrication of low doping areas, such as the base zones of bipolar transistors, that the wafers are exposed for a precisely predetermined time to an oxidizing atmosphere, and that once fixed the temperature is carefully maintained. During this second heating process, the silicon wafers are exposed at 925° C. for 10 minutes to 1.5 liter oxygen per minute, then for 51 minutes to steam, and finally for another 10 minutes to 1.5 liter oxygen per minute. During this processing, the boron is driven into the silicon, with areas 10 and 11 being formed. Areas 10 serve as base zones of bipolar transistors, and areas 11 serve isolation purposes together with areas 3 and 4. During the production of these areas of low boron doping there grows at the same time a silicon dioxide layer 5D (FIG. 1D) which can be used for masking purposes. Furthermore, a substantial part of the boron contained in the silicon is dissolved in oxide so that the surface resistance increases considerably. Subsequently, areas 12 and 13 of high N-doping are made in a known manner, area 13 serving for facilitating collector connection and for the connection between the silicon surface and the subcollector area 3, and area 12 serving as an emitter zone of a bipolar transistor. FIG. 1E shows the completed structure. It contains a silicon dioxide layer (not shown) with openings for contacting areas 10, 11, 12, and 13.

Using the method as disclosed by the invention in the above described boron diffusion for fabricating the structure shown in FIG. 1E presents various advantages compared with formerly used methods. By replacing the use of concentrated nitric acid heated to 95°, which had been used up to now for dissolving the sparingly soluble borosilicate glass layer 9, with an aqueous sulfuric acid/potassium permanganate solution applicable at room temperature, environment problems are eliminated and safety factors are reduced. There is no corrosion of the apparatus used. The costs for the chemicals can be reduced by a factor of approximately 20, and the solution can be prepared without any problem. Furthermore, as shown by measuring the surface resistance values, the base diffusion profiles are not affected.

We claim:
1. In a method for doping silicon bodies where the silicon bodies are exposed in a first heating process to a gas mixture containing a predetermined boron quantity and boron and oxygen in a predetermined quantitative ratio to form a borosilicate glass layer, a boron-rich silicon dioxide layer and a $SiB_6$ layer, and where in a second heating process at least part of the boron is driven into the silicon, and that prior to the second heating process the borosilicate glass is completely stripped off without the $SiB_6$ layer being substantially affected, the improvement comprising stripping the borosilicate glass layer and the boron-rich silicon dioxide layer by first immersing the silicon bodies in hydrofluoric acid diluted with water and subsequently in an aqueous sulfuric acid/potassium permanganate solution.

2. The method of claim 1 wherein the aqueous sulfuric acid/potassium permanganate solution is obtained by dissolving from about 0.5 to about 5 gm/l of potassium permanganate in aqueous sulfuric acid having from about 5 to about 20 percent by weight of sulfuric acid.

3. The method of claim 1 wherein the aqueous sulfuric acid/potassium permanganate solution is obtained by dissolving 1.6 g/l potassium permanganate in a 10% by weight aqueous sulfuric acid.

4. The method as claimed in claims 1, 2 or 3, wherein the silicon bodies are immersed for approximately 10 to 30 seconds in hydrofluoric acid diluted with water at a ratio of 1:10 and for 1 to 3 minutes in the aqueous sulfuric acid/potassium permanganate solution.

5. The method as claimed in claims 1 or 4, wherein the stripping of the borosilicate glass layer and of the boron-rich silicon dioxide layer from the silicon bodies is performed at ambient temperature.

6. The method as claimed in claim 1, wherein the $O_2$:boron ratio and the boron quantity added per time unit to the gas mixture are determined in such a manner that borosilicate glass is obtained which is stripped in diluted hydrofluoric acid only incompletely.

7. The method as claimed in claim 1, wherein a partially masked surface of the silicon bodies is exposed in a first heating process to a carrier gas flow to which is admixed during coating BBr$_3$ and an oxygen quantity adapted thereto, and that an O$_2$:BBr$_3$ molar ratio between about 20 and 65 is used.

8. The method as claimed in claims 1 and 7 wherein the first heating process is at a temperature of between about 850° and 950° C.

9. The method as claimed in claim 1, wherein after the first heating process and the stripping of the borosilicate glass the boron is driven into the silicon in an oxidizing atmosphere during a second heating process.

10. The method as claimed in claims 1 and 9, wherein the second heating process is at a temperature of about 925° C.

11. The method as claimed in claims 1 and 10, wherein base zones of bipolar transistors in highly integrated circuits are made by the method.

* * * * *